United States Patent [19]

Ames et al.

[11] 4,316,200

[45] Feb. 16, 1982

[54] CONTACT TECHNIQUE FOR ELECTRICAL CIRCUITRY

[75] Inventors: Irving Ames, Peekskill; Wilhelm Anacker, Katonah; Kurt R. Grebe, Beacon; Charles J. Kircher, Yorktown Heights, all of N.Y.

[73] Assignee: International Business Machines Corporation, Armonk, N.Y.

[21] Appl. No.: 128,219

[22] Filed: Mar. 7, 1980

[51] Int. Cl.³ .............................................. H01L 39/22
[52] U.S. Cl. ......................................... 357/5; 357/4; 357/65; 357/71
[58] Field of Search .......................... 357/71, 5, 4, 65

[56] References Cited

U.S. PATENT DOCUMENTS

| | | | |
|---|---|---|---|
| 3,645,785 | 2/1972 | Hentzschel | 117/217 |
| 3,663,184 | 5/1972 | Wood | 29/195 |
| 3,939,047 | 2/1976 | Tsunemitsu | 204/15 |
| 4,107,726 | 8/1978 | Schilling | 357/71 |
| 4,177,476 | 12/1979 | Kroger | 357/5 |

OTHER PUBLICATIONS

Barry et al., *IBM Journ. Res. Develop.*, vol. 13, No. 3, May 1969, p. 286.

Howard et al., *IBM Tech. Discl. Bull.*, vol. 20, No. 9, Feb. 1976, p. 3477ff.

*Primary Examiner*—Martin H. Edlow
*Attorney, Agent, or Firm*—Jackson E. Stanland

[57] ABSTRACT

In electrical circuitry, and particularly superconducting circuitry including Josephson tunnelling devices, it is often necessary to provide solder contacts to electrical lines, where the electical lines would be destroyed if there were interdiffusion between the lines and the solder. To avoid this problem, a laterally extending metallic layer is used as a diffusion barrier between the solder land and the electrical line which can be a superconducting line. The diffusion barrier is comprised of a refractory metal which has a first portion electrically contacting the solder land and a second, laterally displaced portion, electrically contacting the electrical line. An insulating protective layer on the diffusion barrier layer separates the solder land and the electrical line. In a specific embodiment, the superconducting electrical line is comprised of an alloy of lead while the diffusion barrier is comprised of niobium, and the solder alloy is a low melting point alloy, typically comprised of indium, bismuth, and tin.

12 Claims, 3 Drawing Figures

CONTACT TECHNIQUE FOR ELECTRICAL CIRCUITRY

DESCRIPTION

1. Technical Field

This invention relates to a technique for interconnecting electrical circuitry, such as that employing Josephson tunnelling devices, and in particular to a technique wherein solder lands can be used to make electrical connection to circuitry without interdiffusion between the circuitry and the solder.

2. Background Art

In semiconductor circuitry, microelectronic packaging techniques are known in which solder lands are used to provide electrical contact to underlying circuit lines. For example, aluminum alloy electrical lines are electrically contacted by solder lands which are formed through openings in an $SiO_2$ protective layer formed over the aluminum alloy lines. There is often an intermediate layer between the solder land and the underlying aluminum alloy lines. For example, an intermediate layer comprising superimposed films of chromium, copper, and gold is used between the solder and the aluminum alloy circuit lines, in order to facilitate electrical and mechanical contact from the solder to the aluminum alloy lines and the $SiO_2$ protective layer.

Additionally, such an intermediate layer provides some amount of protection against interdiffusion between the constituents of the solder and the aluminum alloy lines. Such diffusion may have deleterious effects on the aluminum alloy lines in the case of semiconductor circuitry or on superconductive lines in the case of superconductive circuitry.

For example, the superconducting electrical lines used to make contact to Josephson device circuits can comprise alloys of lead such as a lead-indium-gold alloy. If a solder is used, there would be rapid diffusion of the solder components into the lead alloy lines, and also the possibility of movement of material from the superconducting lines into the solder. This may cause changes in the superconducting critical temperature of the lines and the circuitry to which they are connected. Additionally, it may also result in the formation of voids, in accordance with the Kirkendall effect, leading to the formation of open circuitry.

In superconducting Josephson device circuits, a ground plane is often used, which is insulated from the overlying superconducting devices. Thus, a plurality of superconducting metal lines and electrically insulating lines must be provided. In devising a technique to prevent interdiffusion between the solder lands and the interconnecting superconducting lines, it is desirable to minimize the number of additional processing steps and layers that would be required.

In the practice of the present invention, this has been accomplished in an advantageous manner by providing a laterally extending diffusion barrier. In a particular embodiment, the barrier can be comprised of the same material as that used to form the superconducting ground plane and can be a portion of the layer which forms the ground plane. This can eliminate the need for additional metal layers.

Accordingly, it is a primary object of the present invention to provide electrical connections to device circuitry wherein the problem of interdiffusion between solder contacts and the electrical lines is substantially eliminated.

It is another object of the present invention to provide a technique for electrically interconnecting solder contacts and superconducting electrical lines to prevent interdiffusion therebetween.

It is another object of the present invention to provide a superconducting circuit chip wherein electrical interconnections between solder lands and superconducting electrical lines can be provided without having interdiffusion therebetween, while at the same time maintaining the planarity of the superconducting electrical chip.

It is another object of the present invention to provide electrical interconnections between solder and superconducting electrical lines located on the chip, wherein advantage is taken of the metallurgical properties of a metallic layer which must be present for proper electrical circuit functioning, thereby avoiding the need for additional fabrication steps.

DISCLOSURE OF INVENTION

The practice of this invention is concerned with the difficulty of making electrical contact to electrical lines when the metallurgies of the lines and solder contacts are such that interdiffusion can occur at the processing temperatures, room temperatures, or the temperatures at which the circuits are used or stored. In this environment of potential interdiffusion, the invention comprises the use of a diffusion barrier for preventing intermixing of the solder components and the components in the electrical lines, wherein the diffusion barrier is comprised of a refractory metal and is a lateral diffusion barrier. The term "lateral" means that the diffusion barrier lies in a plane such that one portion of it is used for electrical contact by the solder land, while another portion, laterally displaced from the first portion, is used to provide electrical contact to the electrical line.

The invention does not encompass a structure wherein the electrical line, diffusion barrier layer, and solder land are located in a single vertical structure. A diffusion barrier could not be made in such a structure in a way compatible with the Pb-alloy Josephson devices and wiring which require fabrication temperatures less than about 70° C. The high melting temperature metals which are suitable for use as diffusion barriers in this invention could be highly stressed when prepared at temperatures as low as 70° C. and could cause the underlying Pb-alloy wiring to deform and rupture.

As an example of the present invention, Josephson device circuits are formed on a chip in which superconducting lead based alloys are used to provide electrical currents to Josephson devices. A niobium ground plane is located below the lead alloy circuit and insulated therefrom by an insulating layer. An insulating layer of, for example, SiO is located over the lead alloy electrical line. Niobium diffusion barrier layers, forming pads to which electrical contact is made by solder lands and by the lead alloy electrical lines, are provided. These pads can be coplanar (or non-coplanar) with the superconducting ground plane, but are physically and electrically isolated from the ground plane. The pads have a lateral extent such that a first portion can be contacted by the solder land, while a second portion can be contacted by the lead alloy electrical lines. An insulating layer of, for example, SiO, overlies a portion of the Nb pads and laterally separates the solder and the superconducting lead alloy lines.

This technique of electrical connection can be used when electrically joining one chip to another, one module to another module, or a chip to a module located in a different plane than the chip, etc. Further, in a situation where the diffusion barrier is comprised of a superconducting material and the solder is a superconducting alloy, it is possible to provide an entirely superconducting connection when any non superconducting intermediate layer (discussed below) is thin enough to permit the proximity effect to be operative to render it superconductive.

These and other objects, features, and advantages will be more apparent from the following more particular description of the preferred embodiments.

BEST MODE FOR CARRYING OUT THE INVENTION

Figure 1:
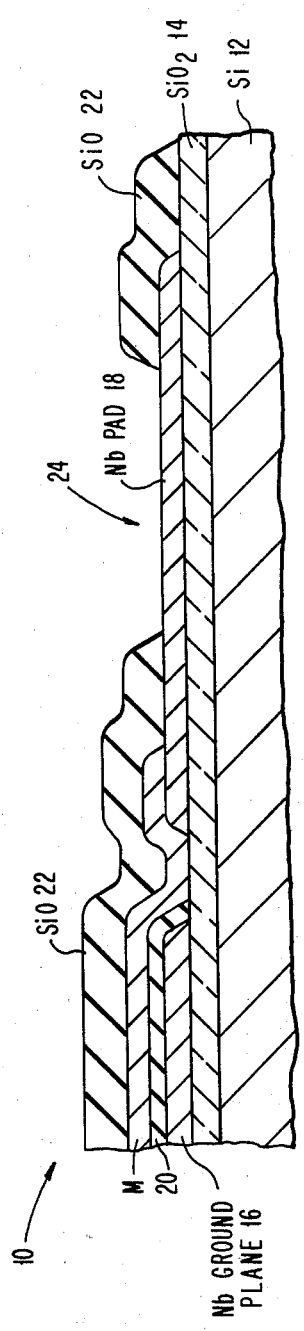
FIG. 1 is a cross-sectional view of a superconducting chip in which diffusion barrier paths are provided for electrical contact to a laterally displaced and overlying electrical line, there being an exposed portion of the diffusion barrier layer to which a solder contact can be formed.

FIG. 1 is a cross-sectional view of a superconducting chip 10, such as a superconducting chip having Josephson tunnelling devices thereon. The chip is comprised of a silicon substrate 12 having a silicon dioxide layer 14 formed thereover. A niobium ground plane 16 is then formed over $SiO_2$ layer 14. The diffusion barrier layer 18 (pad) can also be comprised of niobium, but is electrically separate from the ground plane 16.

One technique for forming pads 18 is to deposit a continuous layer 16 across the entire wafer, followed by an etching step in which the pads 18 are formed. Anodization of Nb ground plane 16 provides $Nb_2O_5$ insulation layer 20, which electrically isolates ground plane 16 and pads 18. Since $Nb_2O_5$ has a relatively high dielectric constant, a layer of SiO is often formed over the $Nb_2O_5$ layer. Thus, layer 20 is an insulating layer, which may be comprised of several layers. A superconducting electrical line M is then formed over insulation layer 20 and in contact with the left-hand portion of Nb pad 18. A protective layer 22, such as SiO, is deposited over the entire chip, except for the regions 24 of pads 18 which are to become bonding sites.

Figure 2:
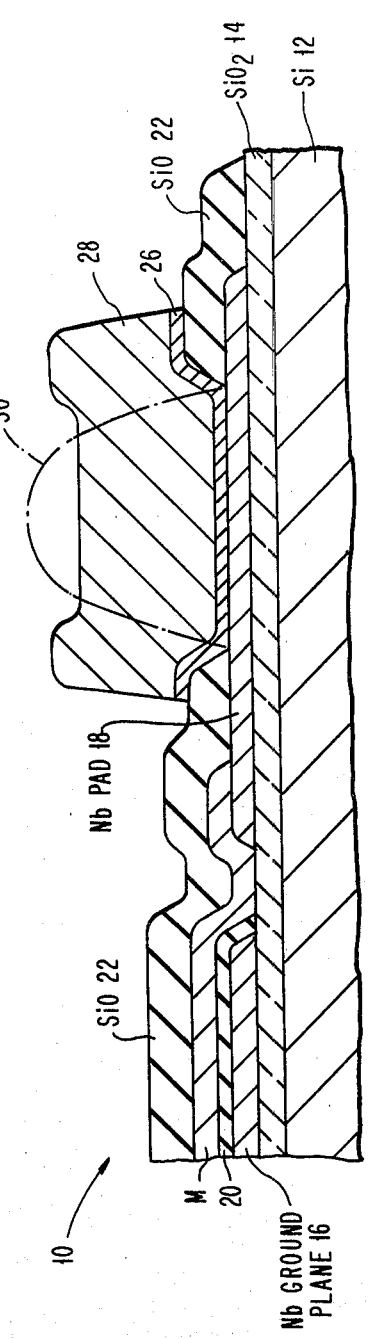
FIG. 2 shows the chip of FIG. 1, having a solder contact deposited over the lateral diffusion barrier pad.

FIG. 2 is the same as FIG. 1, except that an intermediate layer 26 and a solder land 28 have now been deposited over the exposed area 24 of pad 18. The solid line shows the solder 28 as it is deposited, while the dashed line 30 shows the shape of the solder contact after heating to a temperature above its melting temperature.

The layer 26 can comprise a plurality of layers, such as Pd and Au. Layers 26 overlap the edges of SiO layer 22 and serve to enhance the wetability of the solder alloy 28 to Nb pad 18. The solder is typically comprised of a low melting temperature alloy, for example 51% In+32.5% Bi+16.5% Sn, by weight. This is a superconducting alloy and, if the underlayer 26 is superconducting, the entire contact comprising the solder, underlayers, pads 18, and superconducting lines M will be superconductive. Even if some of the layers which comprise layer 26 are non-superconducting metals, they will become superconducting by the proximity effect, if they are sufficiently thin.

It is apparent from FIG. 2 that pad 18 provides an electrical path between superconducting line M and the solder alloy 28. In a particular example, a Josephson device chip 10 would use an electrical line M comprising an alloy of lead, such as a lead-indium-gold alloy. For a solder such as that described in the previous paragraph, a serious interdiffusion problem could result if the diffusion barrier 18 were not used. That is, very rapid interdiffusion would occur between the components comprising the lead alloy line M and the solder 28, especially upon heating to a temperature above the melting point of the latter and the properties of both the electrical line M and adjacent circuitry to which it is connected would be adversely affected. However, this is prevented by the Nb pad 18, which acts as a lateral diffusion barrier to the flow of components between metal line M and solder 28.

Figure 3:
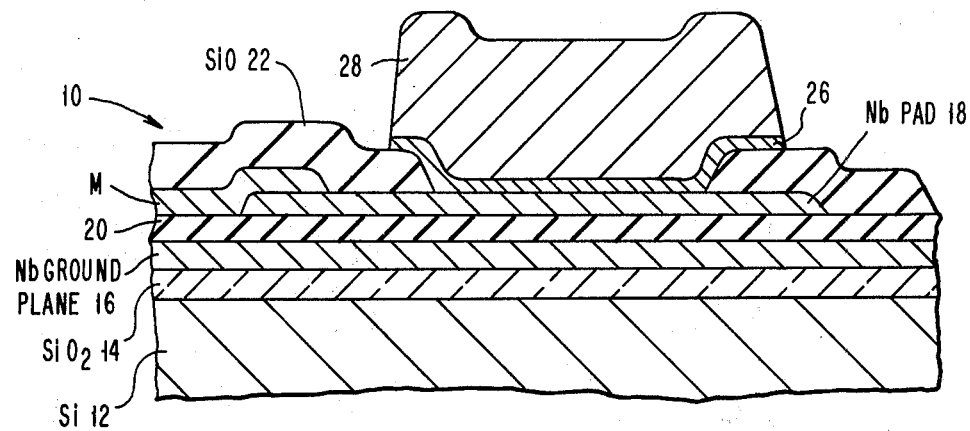
FIG. 3 is a cross-sectional view of a superconducting chip in which the lateral diffusion barrier is located in a plane above the superconducting ground plane.

In FIG. 3, the superconducting ground plane 16 is a continuous layer which is not coplanar with the Nb pads 18. An insulating layer 20 is formed over ground plane 16 and the rest of the structure is the same as that shown in FIG. 2. For this reason, the same reference numerals are used.

In the formation of the chip shown in FIGS. 2 and 3, the processing temperatures are generally kept below about 200° C. in order to prevent diffusion of the metal line M components or the solder components into the Nb pad. A representative thickness for the pad 18 is about 0.2 microns.

While the use of niobium is preferable since niobium is a superconducting material that is also suitable for use as a ground plane 16, other materials should be usable for forming the diffusion barrier pads—in particular, refractory metals, such as Ta, Ti, Mo, W, etc. The higher the melting point of the refractory metal, the less is its self-diffusivity and the more satisfactory should be the barrier that it provides to adverse diffusion. Of course, the use of niobium means that the pads 18 can be formed from a portion of the ground plane layer.

The lateral extent of diffusion barrier 18 is chosen such that the electrical line M makes contact at one portion thereof while the solder 28 and intervening layer 26 make electrical contact to another, laterally displaced, portion thereof. The two portions of the pad 18 to which electrical contact are made are separated by SiO protective layer 22. Thus, the pad 18 has a lateral extent sufficient to have SiO layer 22 between the two portions of the pad which are electrically contacted (typically, the separation between the contacted portions of pad 18 is at least several microns).

To fabricate the lead alloy lines and subsequently formed layers of the chip shown in FIGS. 1 and 2, processing temperatures having an upper limit of only about 70° C. are used. The silicon substrate 12 has a layer 14 of $SiO_2$ thereon. After this, a Nb ground plane 16 is deposited by conventional steps, such as evaporation or sputtering. Pads 18 are etched in the ground plane 16 using known photolithographic masking and etching processes in order to obtain electrical isolation from the ground plane 16. Thus, when the ground plane is electrically contacted for anodization, the $Nb_2O_5$ portion of layer 20 will be formed on the ground plane but not on pads 18. As an alternative, the pads 18 are deposited over the ground plane insulation 20 and patterned by stencil lift-off. This would allow the ground plane to be maintained under the terminals comprising the pads and the solder contacts, as shown in FIG. 3. Here, ground plane 16 would extend below the solder land 28, but be insulated therefrom by insulation layer 20, which is usually comprised of a film of $Nb_2O_5$ and a film of SiO. Nb pads 18 would be formed on layer 20. The rest of the structure of FIG. 3 would be completed in the same manner as that in FIG. 2 (described below).

Prior to deposition of the lead alloy interconnection metallization M, the pads 18 are cleaned by sputter etching. If the sputter etching step degrades the insulation on the chip, separately-deposited thin film lead alloy straps can be used to join the pads 18 to the lead alloy M.

The protective layer 22 of SiO is then deposited over the entire chip, except for the regions 24 of the pads 18 which are to become bonding sites. The exposed portions of pads 18 are then sputter etched through appropriate masks in order to clean them. These masks expose the pad and a rim of the surrounding SiO layer 22. The underlayers 26 and the solder alloy 28 are then deposited preferably in the same vacuum and preferably through use of the same mask. The thickness of the latter is typically 10–100 microns.

What has been described is a technique and structure for providing electrical contacts to electrical lines, such as superconducting lines, without the adverse effects which occur if these electrical lines are comprised of materials into which solder components could easily diffuse. Thus, the inventive element is one in which this problem is present and is in particular represented by a Josephson device chip using lead based alloys for at least some of its superconducting electrical lines.

Having thus described our invention, what we claim as new, and desire to secure by Letters Patent is:

1. A superconductive device circuit, comprising in combination:
    a substrate having thereon superconducting devices and a superconducting electrical line for carrying electrical currents to said devices,
    a bonding layer which must be electrically connected to said superconducting electrical line, said bonding layer and said superconducting electrical line being comprised of components which readily interdiffuse into one another,
    a metallic diffusion barrier layer located between said bonding layer and said superconductive electrical line, said bonding layer contacting said diffusion barrier at a first portion thereof and said superconducting electrical line contacting said diffusion barrier at a second portion thereof laterally displaced from said first portion,
    there being a layer of electrically insulating material located over said diffusion barrier layer and separating said first and second portions from one another.

2. The chip of claim 1, further including a superconducting ground plane which is coplanar with said diffusion barrier layer.

3. The chip of claim 1, where said superconductive devices are Josephson tunnelling devices.

4. The chip of claim 1, where said bonding layer is a low temperature melting solder, said superconductive electrical line is comprised of a lead alloy, and said diffusion barrier layer is comprised of a refractory metal.

5. The chip of claim 4, where said diffusion barrier layer is comprised of niobium.

6. The chip of claim 5, further including a niobium superconducting ground plane which is coplanar with said niobium diffusion barrier.

7. The chip of claim 1, where said devices are Josephson tunnelling devices, and further including a superconducting niobium ground plane, said diffusion barrier layer being comprised of niobium which is coplanar with said ground plane but electrically isolated therefrom, and said bonding layer is comprised of a low melting temperature solder.

8. A Josephson device electrical circuit, comprising in combination:
    a substrate having thereon a superconducting electrical current carrying line coupled to a Josephson current device,
    a solder layer which is electrically connected to said superconducting electrical line, said solder and said electrical line being comprised of materials which can interdiffuse into one another to cause adverse effects in said superconducting electrical line,
    a metallic diffusion barrier layer comprising a refractory metal located between said solder layer and said superconducting electrical line, said diffusion barrier layer being electrically contacted by said solder layer at a first portion thereof, and being electrically contacted by said superconducting electrical line at a second portion thereof laterally displaced from said first portion, and
    a layer of electrically insulating material located on said diffusion barrier layer and separating said first and second portions from one another.

9. The circuit of claim 8, where said superconducting electrical line is a lead alloy, and said solder is a superconducting solder, said metallic diffusion barrier layer being comprised of niobium.

10. The circuit of claim 9, further including a niobium ground plane.

11. The circuit of claim 10, where said niobium ground plane is a continuous layer located under said solder land and insulated therefrom, said metallic diffusion barriers being located in another plane.

12. A superconducting circuit arrangement, comprising in combination:
    a substrate having thereon a niobium current carrying line,
    a device exhibiting a Josephson current therethrough,
    a solder layer which is electrically connected to said niobium superconducting line, said niobium line being electrically connected to said Josephson device at a location laterally separate from its connection to said solder layer.

* * * * *